United States Patent
Tegen et al.

(10) Patent No.: US 7,439,125 B2
(45) Date of Patent: Oct. 21, 2008

(54) CONTACT STRUCTURE FOR A STACK DRAM STORAGE CAPACITOR

(75) Inventors: Stefan Tegen, Dresden (DE); Klaus Muemmler, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 11/439,441

(22) Filed: May 24, 2006

(65) Prior Publication Data

US 2006/0270146 A1    Nov. 30, 2006

(30) Foreign Application Priority Data

May 31, 2005    (DE) .................. 10 2005 024 944

(51) Int. Cl.
*H01L 21/8234* (2006.01)

(52) U.S. Cl. ............... 438/238; 438/210; 438/241; 438/253; 438/257; 438/258; 257/E21.577; 257/E21.583

(58) Field of Classification Search .......... 438/210, 438/258
See application file for complete search history.

(56) References Cited

U.S. PATENT DOCUMENTS

| 5,583,360 A * | 12/1996 | Roth et al. ............... 257/316 |
| 6,025,227 A | 2/2000 | Sung |
| 6,320,260 B1 | 11/2001 | Kohyama et al. |
| 2003/0022486 A1 * | 1/2003 | Wu ......................... 438/639 |
| 2004/0161923 A1 | 8/2004 | Bae et al. |
| 2005/0079673 A1 * | 4/2005 | Seo et al. ................. 438/257 |

FOREIGN PATENT DOCUMENTS

| DE | 43 45 413 C2 | 6/1994 |
| WO | WO 01/08217 A1 | 2/2001 |

* cited by examiner

*Primary Examiner*—Charles D. Garber
*Assistant Examiner*—Kyoung Lee
(74) *Attorney, Agent, or Firm*—Edell, Shapiro & Finnan, LLC

(57) ABSTRACT

A method for fabricating a contact structure for a stack storage capacitor includes forming the contact structure in a node contact region with contact openings, an insulating liner and a conductive filling material prior to the patterning of bit lines.

16 Claims, 7 Drawing Sheets

CONTACT STRUCTURE FOR A STACK DRAM STORAGE CAPACITOR

CROSS REFERENCE TO RELATED APPLICATIONS

This application claims priority under 35 USC §119 to German Application No. DE 10 2005 024 944.2, filed on May 31, 2005, and titled "Contact structure for a stack DRAM storage capacitor," the entire contents of which are hereby incorporated by reference.

FIELD OF THE INVENTION

The invention relates to a method for fabricating a contact structure for a storage capacitor in stack DRAM semiconductor memories.

BACKGROUND

Dynamic random access memories (DRAMs) use charge which can be stored and read on a storage capacitor in a cell array of the DRAM to characterize a digital state, for example a "1" or a "0". The charge which can be stored on the storage capacitor is supplied and removed by a flow of current via a select transistor. The select transistor used is usually a MOSFET (metal oxide semiconductor field effect transistor), the conductivity of which is controlled, in a channel region formed in the semiconductor body of the DRAM, by field effect via a gate conductor structure which is electrically separated from the channel region by a gate insulator structure. The channel region is located between semiconductor zones formed as source and drain regions in the semiconductor body. One of the semiconductor zones is electrically connected to the storage capacitor, and its connection region to the corresponding semiconductor zone is referred to as the node contact (CN: Contact Node). The other of the two semiconductor zones is connected via a bit line contact (CB: Contact Bit Line) to a bit line which is formed in a metallization level, for example a M0 level, and conductively connects the select transistor to an evaluation circuit, for example to a sense amplifier in a support region of the DRAM. The DRAM usually has a plurality of select transistors which are arranged in rows and columns and can be individually driven via the bit lines and gate conductor structures in the form of word lines.

DRAM semiconductor memory components are usually designed with a trench capacitor or stack capacitor for storing charge. In the case of the trench capacitor, the storage capacitor is formed in a trench which extends into the semiconductor body, while in the case of stack capacitors the storage capacitor is formed above the semiconductor body in a wiring region for connection of the semiconductor components in the semiconductor body. A conductive connection between the storage capacitor and the node contact of the select transistor is provided by a contact structure for the storage capacitor (CC: Contact Capacitor).

At present, in the known fabrication of stack DRAMs, first of all M0 tracks, i.e. bit lines, are fabricated, followed by the contact structures for the storage capacitor being formed in self-aligned fashion with these tracks. A procedure of this type is subject to restrictions in terms of the width and thickness of the bit lines, since after the bit lines have been formed, a nitride cap usually serves as a spacer (nitride spacer) for subsequent contact hole patterning for connection of the storage capacitor. This step is carried out as a self-aligned etching step (SAC etch with the nitride cap as mask) and is difficult to implement in terms of process engineering. The nitride spacer also leads to undesirably greater capacitive coupling between the bit lines and the contact structure for the storage capacitor compared to an oxide, such as $SiO_2$. This is attributable to the higher dielectric constant of silicon nitride ($\epsilon_r \approx 7$ for $Si_3N_4$) compared to oxide ($\epsilon_r \approx 3.8$ for $SiO_2$). Since to form the contact structure for the storage capacitor, it is necessary to etch through an interlayer dielectric, for example an M0 oxide, formed between the bit lines, the choice of material for the interlayer dielectric is considerably restricted by its etching properties for the formation of the contact structure.

SUMMARY

The invention provides a method for fabricating a contact structure for a storage capacitor in stack DRAM semiconductor memories which allows the above drawbacks of the known procedure to be avoided.

According to the invention, a method for fabricating a contact structure for a storage capacitor in stack DRAM semiconductor memories comprises the steps of: providing a preprocessed semiconductor substrate, which on a surface includes an insulation layer in which are formed bit line contacts and node contact regions, producing a metallic layer on the insulation layer, producing an auxiliary layer stack, which includes one or more layers, on the metallic layer, producing and patterning a first mask on the auxiliary layer stack, forming contact openings in the auxiliary layer stack, the metallic layer and in the insulation layer in the node contact regions uncovered by the first mask, producing an insulating liner at side walls in the contact openings, producing a conductive filling material in the contact openings, the conductive filling material only incompletely filling the contact openings, producing a further auxiliary layer on the semiconductor substrate, producing and patterning a second mask on the further auxiliary layer in order to form bit lines, removing parts of the further auxiliary layer, of the auxiliary layer stack and of the metallic layer uncovered by the second mask, removing the further auxiliary layer and the auxiliary layer stack and producing an interlayer dielectric on the semiconductor substrate, and removing the interlayer dielectric as far as a top end of the contact openings.

The formation of the contact structure is followed by known further processing of the stack capacitor and completion of the DRAM. The masks used to pattern the contact openings and the bit lines are used in particular as etching protection for regions located below the masks, with the regions uncovered by the masks being removed until the etch is stopped. In the contact openings, which are only incompletely filled by the conductive filling material, the further auxiliary layer formed on the filling material protects the conductive filling material in the contact openings from itself being attacked during definition of the bit lines by corresponding removal of the metallic layer. The preprocessed semiconductor substrate, which is usually a substrate made from silicon or another semiconductor element, such as Ge, or a compound semiconductor, such as GaAs, includes semiconductor zones which are formed in the interior of the semiconductor body and have been defined, for example, with the aid of implantation steps for introducing dopants and activation and annealing steps. These semiconductor zones form semiconductor components, such as select transistors, in what is known as an active area of the semiconductor body in the cell array region of the DRAM or alternatively transistors in a support zone used to drive the select transistors. Known process steps are used to provide the preprocessed semiconductor substrate.

In an exemplary embodiment, the metallic layer is formed from tungsten. The M0 tracks, i.e. the bit lines used to drive the select transistors via the array regions, are formed from the metallic layer. In addition to tungsten, other metallic elements or element compounds, such as aluminum or copper, are also suitable.

In another embodiment, the auxiliary layer stack is formed from a polysilicon layer and a nitride layer above it. The auxiliary layer stack protects in particular the metallic layer from being damaged by method steps used to form the contact structures. The nitride layer serves as a protective layer during the patterning of the poly and tungsten layer and during the recessing of the conductive filling material in the contact openings.

In a further advantageous embodiment, the nitride layer is removed after production of the conductive filling material and before production of the further auxiliary layer.

A resist layer can be used as the first and/or second mask. Therefore, both the first mask used to form the contact openings as far as the node contact regions and the second mask used to define the bit lines, i.e. to pattern the metallic layer, can be in the form of resist. To produce the first and/or second mask, the resist layer, which is usually in the form of photoresist, is photolithographically patterned.

In a further embodiment, in the node contact regions contact plugs of polysilicon or tungsten are formed in the insulation layer extending onto the active area of the select transistor. Polysilicon contacts are of the n-conductivity type when an n-channel MOSFET is present as select transistor.

The insulating liner can be formed as an oxide, such as for example $SiO_2$. Since $SiO_2$ has a lower dielectric constant than silicon nitride (e.g. $Si_3N_4$), this has the advantage of reduced capacitive coupling between the bit lines and the contact structure for the storage capacitors.

In another embodiment, the insulating liner is first of all produced in the contact openings and on the auxiliary layer stack and is retained after a spacer etch at the side walls in the contact openings.

During the spacer etch, the parts of the liner which lie on the auxiliary layer stack and the parts of the liner which lie in a base region of the contact openings are removed, with the result that the liner remains present substantially at the side walls in the contact holes.

In another embodiment, the conductive filling material in the contact openings is tungsten or polysilicon, and the contact openings are first of all completely filled with the conductive filling material and, thereafter, the conductive filling material is removed substantially from an upper end of the contact openings as far as halfway along the auxiliary layer stack. This step, which is also known as recessing, allows the conductive filling material in the contact openings to be covered with the further auxiliary layer as far as the upper end of the contact openings, so that during subsequent etching processes, as occur for example during the patterning of the bit lines, the conductive material is protected.

The interlayer dielectric can be formed as a spin-on dielectric (SOD). The spin-on dielectric applied after the patterning of the bit lines in particular has good insulator and filling properties. Since the contact openings for the storage capacitor were formed prior to the application of the interlayer dielectric, there is no need for an etch through the interlayer dielectric, and consequently there are more options with regard to the choice of material for the interlayer dielectric than in the known process sequence, in which the contact openings for the node contacts are formed after the formation of the bit lines in self-aligned fashion by etching of the interlayer dielectric. Consequently, the demands imposed on the etching properties of the interlayer dielectric in known fabrication methods become less important, and a spin-on dielectric, materials with a low dielectric constant, can be used.

The interlayer dielectric can be removed using a CMP step. When using a CMP step, the chemical mechanical polishing (CMP) preferably stops on the conductive filling material of the contact openings, so that further processing of the stack capacitor can follow.

Forming the contact structure in accordance with the invention therefore offers significant advantages, such as maximizing the width of the bit lines (M0 width) and increasing the thickness of the bit lines (M0 thickness) due to the possibility of forming a thin spacer (e.g. oxide spacer), i.e., an insulating liner at the side walls of the contact openings, with the result that the resistance of the bit lines can be reduced. There is also no need for a self-aligned contact opening etch with a nitride cap, since the patterning of the metallic layer used to form the bit lines only has to be carried out selectively with respect to the auxiliary layer and insulation layer, which are generally in oxide form. Likewise, more filling options result with regard to the filling methods and the material for an interlayer dielectric, since there is no need to etch through the dielectric (the contact openings have already been formed) and lower aspect ratios are used.

Reduced coupling between M0, i.e., the bit lines formed from the metallic layer, and CC, i.e., the conductive filling material in the contact openings as contact for the storage capacitor, also results, since an oxide spacer can be used instead of a nitride spacer. The lower dielectric constant of oxide, such as $SiO_2$, compared to nitride, such as $Si_3N_4$, brings about this advantageous effect. Moreover, a larger diameter of the conductive filling material in the contact openings, i.e., CC diameter, can be achieved on account of a thin oxide spacer, which leads to a reduced contact resistance on account of a larger contact surface.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
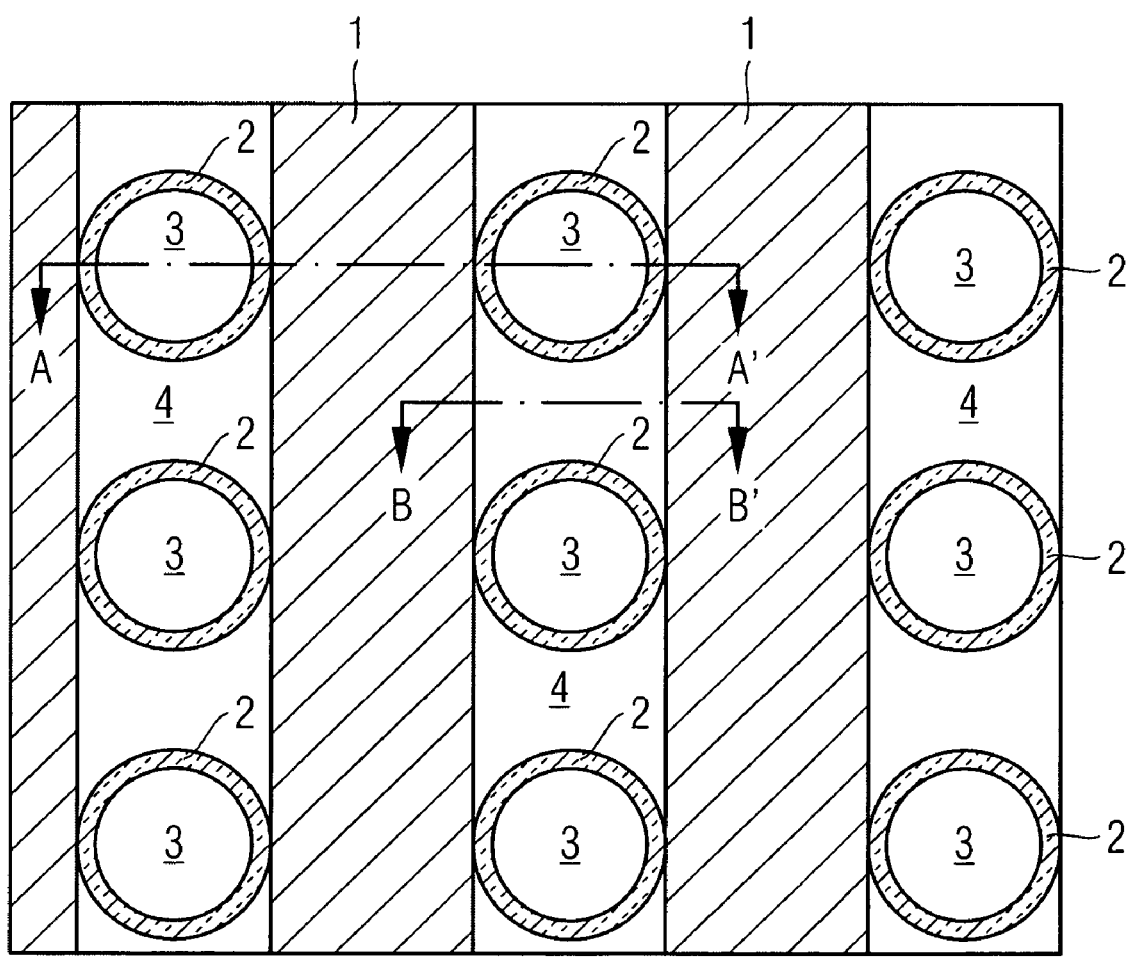
FIG. 1 depicts a top view in plan of a cell array of a DRAM with contact structures for a storage capacitor.

FIG. 1 illustrates a diagrammatic plan view onto a cell array of a stack DRAM with contact structures formed for the storage capacitor. Contact openings 3, which are electrically insulated from the bit lines by an insulating liner 2 and are filled with a conductive filling material, have been formed between strip-like bit lines 1 formed next to one another from a metallic layer. Moreover, the bit lines 1 are insulated and spaced apart from one another by an interlayer dielectric 4.

Section lines AA' and BB' shown in FIG. 1 are used to indicate corresponding cross-sectional views illustrated in FIGS. 2 to 7 for describing successive process stages during the fabrication of the contact structure in accordance with an exemplary embodiment of the invention. Section line AA' indicates a cross section through two adjacent contact openings for the storage capacitor, while section line BB' shows a cross-sectional view between adjacent contact openings and adjacent bit lines 1. In FIGS. 2 to 7, the cross-sectional views on section lines AA' and BB' have been integrated in one cross-sectional illustration, for the sake of simplicity. In this case, the cross-sectional view on section line AA' from FIG. 1 is in each case illustrated in the left-hand part, and the cross-sectional view on section line BB' from FIG. 1 is illustrated in the corresponding right-hand part of FIGS. 2 to 7.

Figure 2:
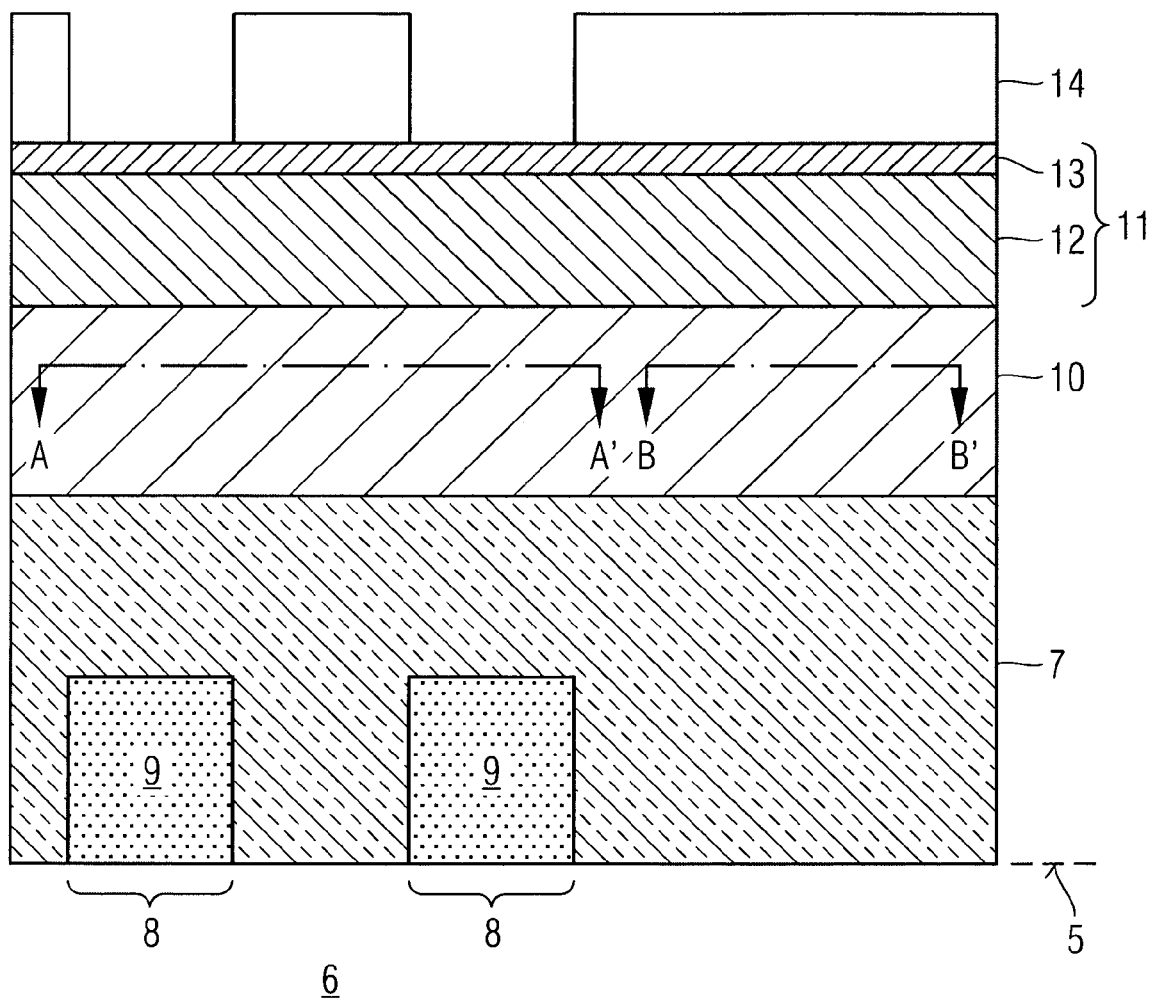
FIGS. 2-7 depict cross-sectional views of a contact structure during successive process stages in accordance with an embodiment of the invention.

FIG. 2 shows a diagrammatic cross-sectional view at the start of a process sequence used to form the contact structures for the storage capacitor. The starting point for the fabrication of the contact structures according to one embodiment of the invention is an insulation layer 7 formed on a surface 5 of a semiconductor body 6. This provides a preprocessed semiconductor substrate. In the preprocessed semiconductor substrate, contact plugs 9 of conductive polysilicon, which serve as an etching stop during the subsequent opening of the contact structure and extend to the surface 5 of the semiconductor body 6, are in embedded inside the insulation layer 7 in a node contact region 8. The contact plugs 9 of the conductive polysilicon are usually of the n-conductivity type, since the select transistor used is an n-channel MOSFET, the source and drain regions of which are of the $n^+$-conductivity type. The contact plugs may also be formed, for example, from tungsten.

After the preprocessed semiconductor substrate has been provided, first of all a metallic layer 10, which is formed from tungsten and from which bit lines are formed in subsequent steps, is applied to the preprocessed semiconductor substrate. An auxiliary layer stack 11, including a polysilicon layer 12 and a nitride layer 13, in particular a silicon nitride layer, above it, is produced on the metallic layer 10. To form the contact openings 3, a photoresist, which serves as first mask 14, is applied to the auxiliary layer stack 11 and photolithographically patterned. For this purpose, the photoresist is removed in the region of the contact openings 3 which are to be formed in the node contact region 8, where it uncovers the auxiliary layer stack 11. This patterning is therefore a CC (Contact Capacitor) patterning for defining the contact openings 3 for the storage capacitor.

Figure 3:
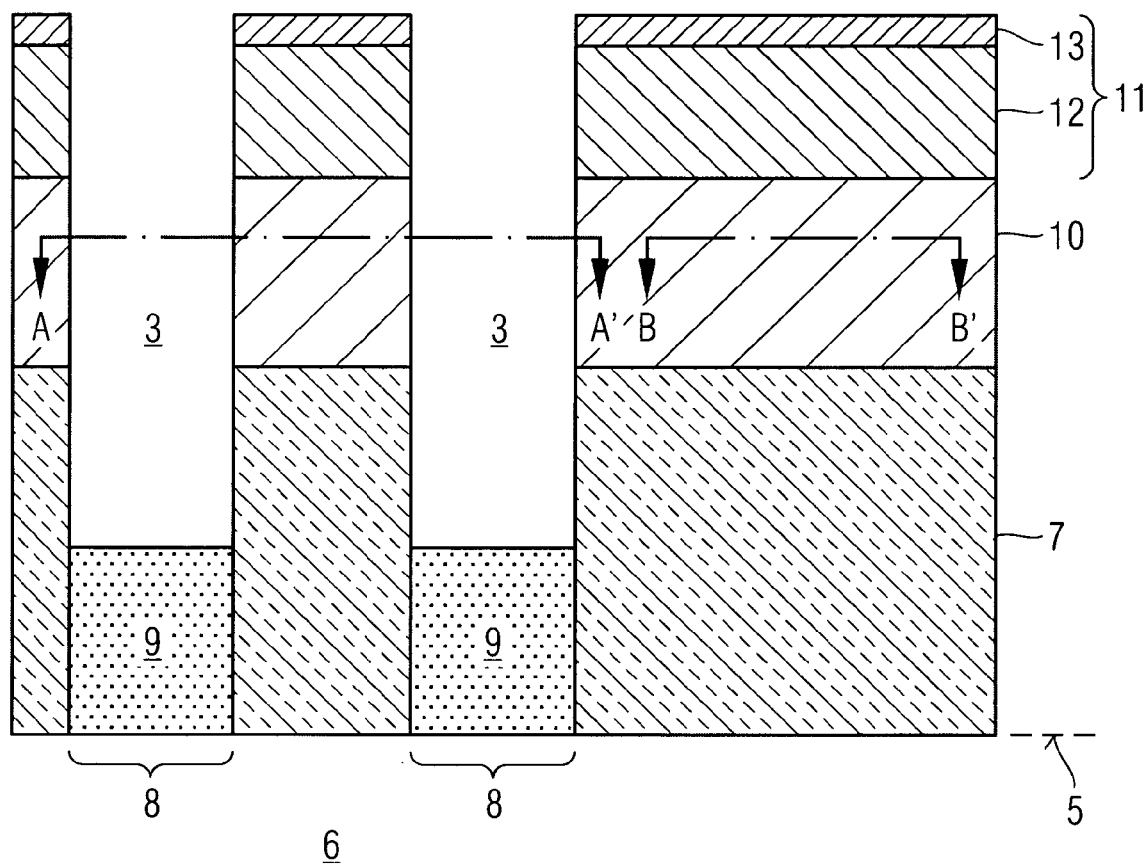

FIG. 3 shows a diagrammatic cross-sectional view through the contact structure for the storage capacitor during a subsequent process stage which follows the cross-sectional view from FIG. 2. Subsequent to the process steps on which the diagrammatic cross-sectional view shown in FIG. 2 is based, to arrive at the diagrammatic cross-sectional view illustrated in FIG. 3, first of all the auxiliary layer stack 11 is removed with the aid of the first mask 14, by etching, in the regions uncovered by the first mask 14. The etching of the auxiliary layer stack 11 was followed by an etch through the metallic layer 10 and also through the insulation layer 7, which is formed as an oxide. The etch does not continue all the way to the surface 5 of the semiconductor body 6, with the result that semi-conductor zones which are formed in the semiconductor body 6 and define the electrical properties of the select transistor have not been uncovered. The provision of the contact openings is followed by removal of the silicon nitride layer 13.

Figure 4:
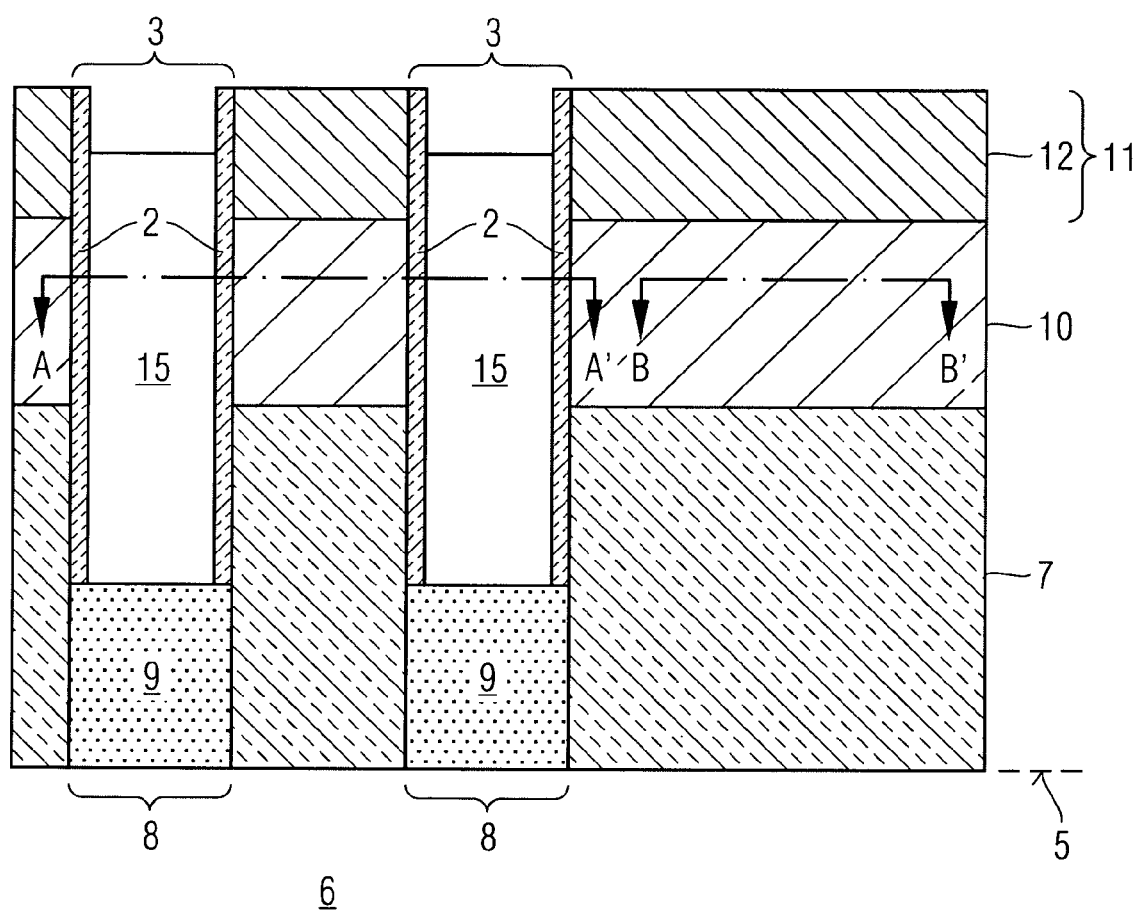

FIG. 4 shows a further cross-sectional view through a process stage which follows the formation of the contact openings 3 as shown in FIG. 3. Here, first of all an insulating liner 2 formed from an oxide, in particular $SiO_2$, is produced over the surface of the silicon nitride layer 13 and inside the contact openings 3 (not shown), the insulating liner 2 is removed on the silicon nitride layer 13 and in a base region of the contact opening 3 by a spacer etch, with the result that a side wall spacer is retained only at side walls within the contact openings 3. The insulating liner 2, which is formed as a side wall spacer, serves as electrical insulation between the bit lines 1 and the contact structure for the storage capacitor.

The formation of the insulating liner 2 is followed by the production of a conductive filling material 15 made from tungsten in the contact openings 3, the conductive filling material 15 incompletely filling the contact openings 3. In particular, the conductive filling material 15 is first of all produced so as to completely fill the contact openings 3 and also above the contact openings 3 and on the silicon nitride layer 13 (not illustrated), and then, in a recessing step, is etched back both on the silicon nitride layer 13 and also partially inside the contact opening 3. The conductive filling material 15 is etched back substantially from an upper end of the contact openings 3 to halfway along the polysilicon layer 12. Thus, an upper end of the conductive filling material 15 extends toward the upper end of the contact openings 3 as far as half the width of the auxiliary layer stack 11.

After the etchback step of the conductive filling material 15, also known as a recessing step, the silicon nitride layer 13 is removed. A recessing step of this type is carried out in order for the conductive filling material 15 in the contact openings 3 to be covered with a further auxiliary layer 16 in a subsequent process step, so that it is protected from subsequent patterning of the metallic layer 10.

Figure 5:
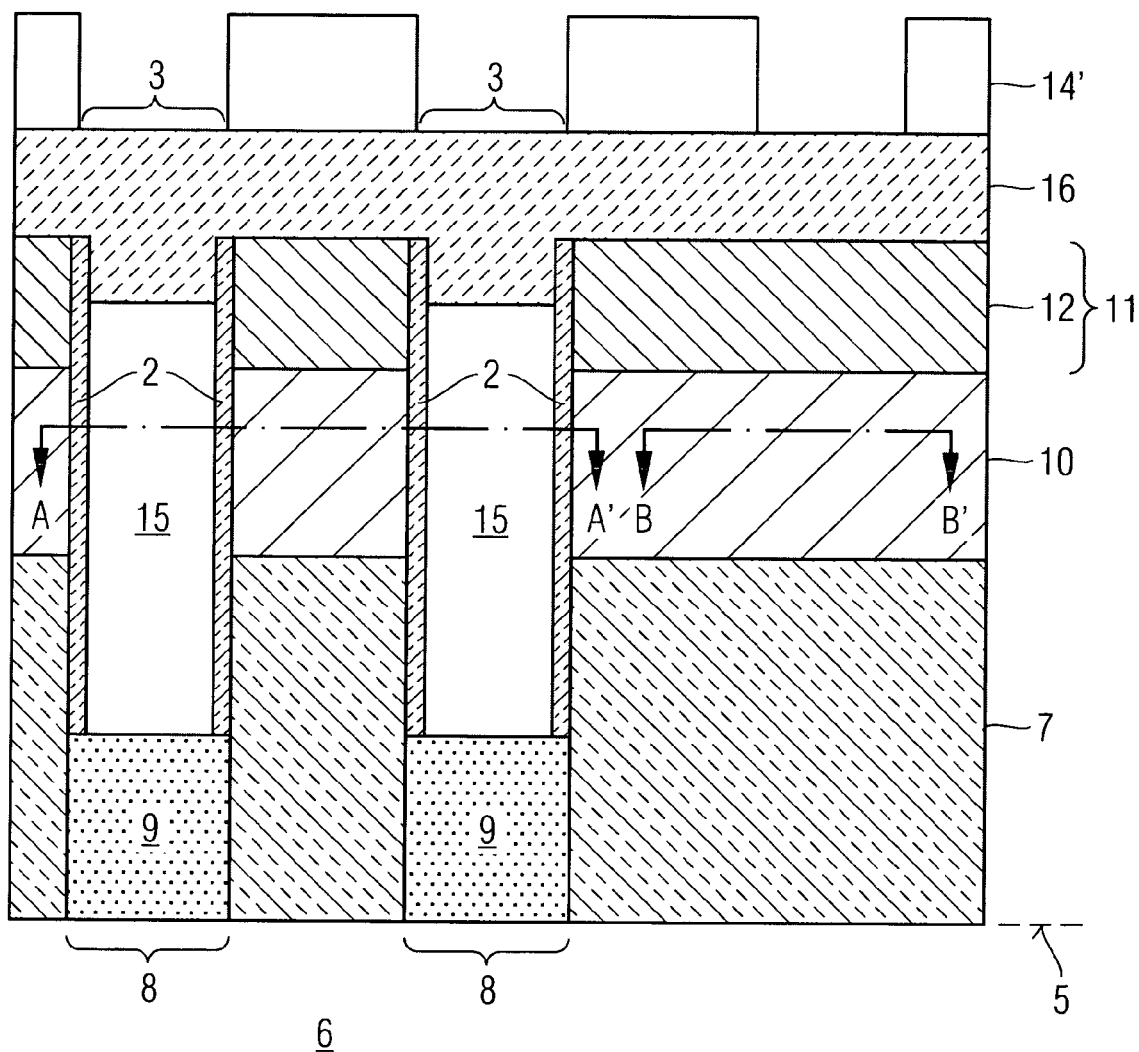

FIG. 5 shows a diagrammatic cross-sectional view through a process stage during the formation of the contact openings which is after the process stage illustrated in cross-sectional form in FIG. 4. Here, the contact openings 3 have been filled with the further auxiliary layer 16, which additionally projects above the contact openings 3 and also covers the polysilicon layer 12. A second mask 14', which is formed as a photoresist, rests on the further auxiliary layer 16 for patterning the bit lines 1. Parts of the auxiliary layer 16 are uncovered along adjacent contact openings 3 extending parallel to the bit lines 1 which are to be formed. Since the contact openings 3 are electrically insulated from adjacent bit lines 1 by the insulating liner 2, the contact openings 3 naturally contribute to the formation of the bit lines 1. Therefore, it is only necessary to remove the metallic layer 10 in the intermediate regions to define the bit lines 1. At this point, it should be noted that the cross-sectional view on section line BB' illustrated in FIG. 5 is a cross section which precedes or follows the cross section in the plane of the drawing denoted by AA', and an opening illustrated on the far right of the second mask 14' in FIG. 5 precedes or follows the middle opening of the second mask in the plane of the drawing in FIG. 5 (also in FIG. 1).

Figure 6:
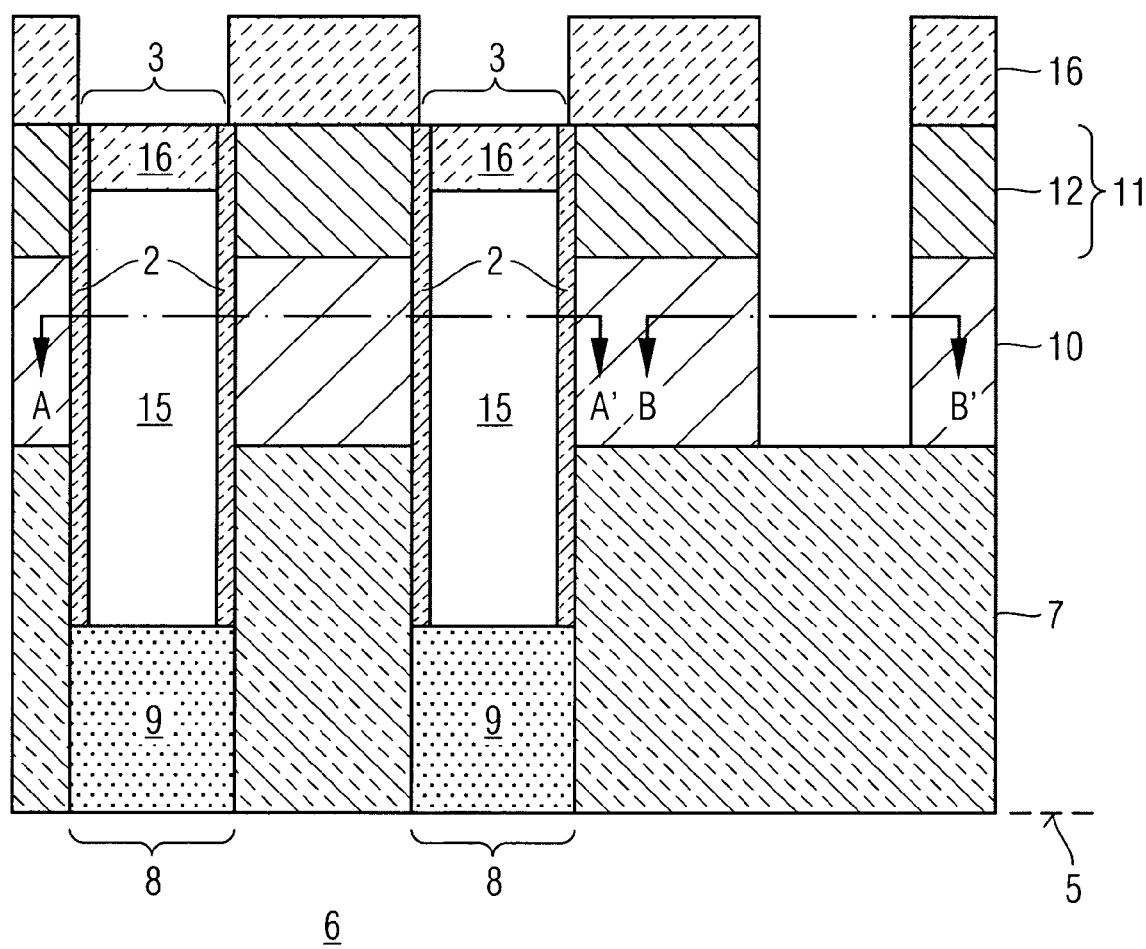

In the cross-sectional view of a process stage for fabricating the contact structure shown in FIG. 6, the bit lines have been patterned. For this purpose, first of all the further auxiliary layer 16 was removed as far as the polysilicon layer 12 in accordance with the second mask 14'. Then, the second mask 14' was removed, and thereafter both the polysilicon layer 12 and the metallic layer 10 were opened up by etching with the aid of the further auxiliary layer 16, which now acts as a mask. Therefore, the bit lines 1 are formed as illustrated in the plan view presented in FIG. 1. The opening shown in cross-sectional view BB' is responsible for ensuring a distance between the bit lines 1 in the intermediate region.

Figure 7:
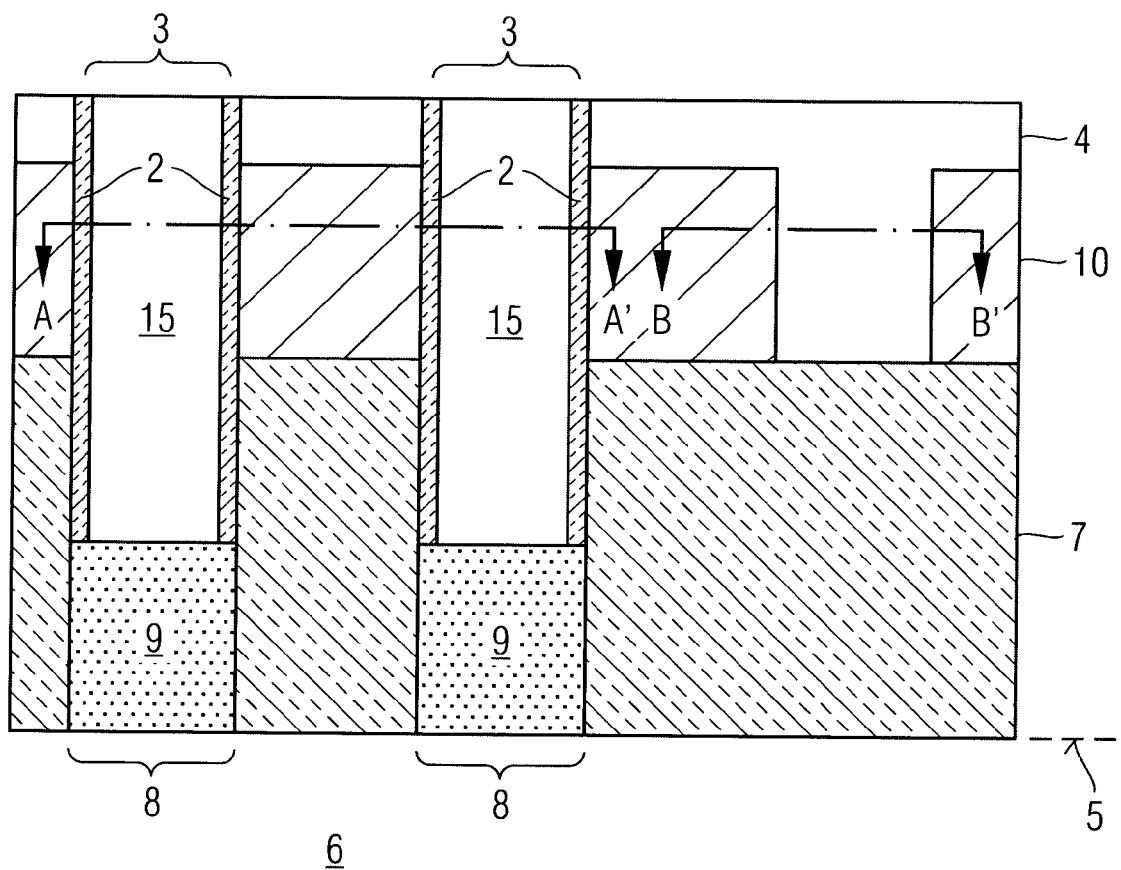

In the cross-sectional view shown in FIG. 7, which follows a process stage which is diagrammatically depicted in FIG. 6, starting from FIG. 6 the further auxiliary layer 16 and the polysilicon layer 12 have been removed. Then, an interlayer dielectric 4 was used both to fill the previously opened intermediate regions and to cover the semiconductor substrate, i.e., a surface which is uncovered according to the process stage. A CMP step is used to remove the interlayer dielectric 4 as far as the conductive filling material 15, so that the conductive filling material 15 serves as a stop for the CMP step. This results in the cross-sectional view illustrated in FIG. 7, which is followed by further known steps for forming the storage capacitor, which is designed as a stack capacitor. As can be seen in FIG. 7, the interlayer dielectric 4 is substantially coplanar and corresponds with the top ends of the contact openings 3.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF DESIGNATIONS

1 Bit line
2 Insulating liner
3 Contact opening
4 Interlayer dielectric
5 Surface
6 Semiconductor body
7 Insulation layer
8 Node contact region
9 Contact plugs
10 Metallic layer
11 Auxiliary layer stack
12 Polysilicon layer as auxiliary layer
13 Nitride layer as auxiliary layer
14, 14' First mask, second mask
15 Conductive filling material
16 Further auxiliary layer

What is claimed:

1. A method for fabricating an integrated circuit, the method comprising:
    forming contact openings in a conductive layer;
    forming an insulating liner at side walls in the contact openings;
    forming a conductive filling material in the contact openings; and
    subsequently selectively removing portions of the conductive layer to form conductive lines adjacent the contact openings.

2. The method of claim 1, wherein the conductive filling material incompletely fills the contact openings.

3. The method of claim 1, wherein the conductive layer is formed from tungsten.

4. The method of claim 1, wherein the insulating liner is formed from oxide.

5. The method of claim 1, wherein the conductive layer is formed on an insulating layer formed on a surface of a substrate.

6. The method of claim 5, further comprising forming contact plugs of polysilicon or tungsten in the insulation layer and extending to the semiconductor body, the contact plugs being aligned with the contact openings.

7. The method of claim 1, wherein the contact openings are formed as contact openings for a storage capacitor, and wherein the conductive lines are formed as bit lines.

8. The method of claim 1, wherein the contact openings are formed by:
    producing an auxiliary layer stack on the conductive layer, the auxiliary layer stack including one or more auxiliary layers;
    producing and patterning a first mask on the auxiliary layer stack; and
    forming the contact openings in the auxiliary layer stack and the conductive layer in node contact regions that are uncovered by the first mask.

9. The method of claim 8, wherein the auxiliary layer stack is formed from a polysilicon layer and a nitride layer disposed above the polysilicon layer.

10. The method of claim 8, wherein the insulating liner is first produced in the contact openings and on the auxiliary layer stack and, after a spacer etch, the insulating liner is retained at the side walls in the contact openings.

11. The method of claim 8, wherein the conductive filling material is tungsten or polysilicon, and the contact openings are first completely filled with the conductive filling material and subsequently the conductive filling material is removed a selected distance from an upper end of the contact openings such that an upper end of the conductive filling material extends toward the upper end of the contact openings as far as half the width of the auxiliary layer stack.

12. The method of claim 8, wherein selectively removing portions of the conductive layer to form conductive lines further comprises:
    forming a further auxiliary layer;
    forming and patterning a second mask on the further auxiliary layer to facilitate the formation of bit lines;
    removing portions of the further auxiliary layer, the auxiliary layer stack, and the conductive layer at areas uncovered by the second mask;
    removing the further auxiliary layer and the auxiliary layer stack and producing an interlayer dielectric; and
    removing portions of the interlayer dielectric until the interlayer dielectric corresponds with top ends of the contact openings.

13. The method of claim 12, wherein the auxiliary layer stack is formed from a polysilicon layer and a nitride layer disposed above the polysilicon layer, and wherein the nitride layer is removed after forming the conductive filling material and before producing the further auxiliary layer.

14. The method of claim 12, wherein at least one of the first and second mask comprises a resist layer.

15. The method of claim 12, wherein the interlayer dielectric is formed as a spin-on dielectric.

16. The method of claim 12, wherein the interlayer dielectric is removed by a chemical mechanical polishing step.

* * * * *